(12) United States Patent
Yang et al.

(10) Patent No.: US 8,288,851 B2
(45) Date of Patent: Oct. 16, 2012

(54) METHOD AND SYSTEM FOR HERMETICALLY SEALING PACKAGES FOR OPTICS

(75) Inventors: Xiao Yang, Cupertino, CA (US); Dongmin Chen, Saratoga, CA (US)

(73) Assignee: Miradia Inc., Sunnyvale, CA (US)

( * ) Notice: Subject to any disclaimer, the term of this patent is extended or adjusted under 35 U.S.C. 154(b) by 1 day.

(21) Appl. No.: 13/086,352

(22) Filed: Apr. 13, 2011

(65) Prior Publication Data

US 2011/0186839 A1 Aug. 4, 2011

Related U.S. Application Data

(60) Division of application No. 11/672,114, filed on Feb. 7, 2007, now Pat. No. 7,948,000, which is a continuation of application No. 11/560,784, filed on Nov. 16, 2006, now Pat. No. 7,671,461, which is a continuation of application No. 10/693,323, filed on Oct. 24, 2003, now Pat. No. 7,303,645.

(51) Int. Cl.
*H01L 23/48* (2006.01)

(52) U.S. Cl. ............. 257/685; 257/E23.01; 257/48; 257/E23.18; 257/E23.117; 257/E33.058; 257/E33.001; 257/E23.193; 257/676; 257/433; 257/760; 257/99; 257/89; 257/680; 257/704; 257/687; 257/678; 257/724; 257/686; 257/723

(58) Field of Classification Search .............. 257/678, 257/E23.18, E21.001, E31.117, 676, 433, 257/760, 99, E33.058, E33.001, E23.193, 257/89, 680, 704, 687, 724, 728, 686, 685, 257/723, 670, 710, 711, E23.127, E32.193, 257/E21.499, 48, E23.01; 156/300, 299; 438/118, 112, 349, 455, 676, 116

See application file for complete search history.

(56) References Cited

U.S. PATENT DOCUMENTS 3,997,964 A 12/1976 Holbrook et al.
(Continued)

FOREIGN PATENT DOCUMENTS

JP 09-051247 2/1997
(Continued)

OTHER PUBLICATIONS

Smith, G.B., et al., "Surface Structure and Optical Properties of Black Chrome", Applied Physics A: Materials Science & Processing, 1985, vol. 36, pp. 193-204.

(Continued)

*Primary Examiner* — A O Williams
(74) *Attorney, Agent, or Firm* — Kilpatrick Townsend & Stockton LLP

(57) ABSTRACT

A system for hermetically sealing devices includes a substrate, which includes a plurality of individual chips. Each of the chips includes a plurality of devices and each of the chips are arranged in a spatial manner as a first array. The system also includes a transparent member of a predetermined thickness, which includes a plurality of recessed regions arranged in a spatial manner as a second array and each of the recessed regions are bordered by a standoff region. The substrate and the transparent member are aligned in a manner to couple each of the plurality of recessed regions to a respective one of said plurality of chips. Each of the chips within one of the respective recessed regions is hermetically sealed by contacting the standoff region of the transparent member to the plurality of first street regions and second street regions using at least a bonding process to isolate each of the chips within one of the recessed regions.

20 Claims, 9 Drawing Sheets

U.S. PATENT DOCUMENTS

| | | | |
|---|---|---|---|
| 5,457,022 | A | 10/1995 | Hioki et al. |
| 5,915,168 | A | 6/1999 | Salatino et al. |
| 6,084,288 | A | 7/2000 | Farnworth et al. |
| 6,093,623 | A | 7/2000 | Forbes |
| 6,294,439 | B1 | 9/2001 | Saski et al. |
| 6,384,473 | B1 | 5/2002 | Peterson et al. |
| 6,396,711 | B1 | 5/2002 | Degani et al. |
| 6,417,075 | B1 | 7/2002 | Haberger et al. |
| 6,514,789 | B2 | 2/2003 | Denton et al. |
| 6,562,658 | B2 | 5/2003 | Ohuchi et al. |
| 6,566,745 | B1 | 5/2003 | Beyne et al. |
| 6,639,313 | B1 | 10/2003 | Martin et al. |
| 6,653,210 | B2 | 11/2003 | Choo et al. |
| 6,664,503 | B1 | 12/2003 | Hsieh et al. |
| 6,822,326 | B2 | 11/2004 | Enquist et al. |
| 6,856,014 | B1 | 2/2005 | Ehmke et al. |
| 6,879,035 | B2 | 4/2005 | Syllasios et al. |
| 6,900,072 | B2 | 5/2005 | Patel et al. |
| 6,949,398 | B2 | 9/2005 | Lytle et al. |
| 6,952,301 | B2 | 10/2005 | Huibers |
| 6,962,834 | B2 | 11/2005 | Stark |
| 7,065,867 | B2 | 6/2006 | Kim et al. |
| 7,141,870 | B2 * | 11/2006 | Yang .............................. 257/676 |
| 7,285,478 | B2 * | 10/2007 | Yang .............................. 438/455 |
| 7,303,645 | B2 | 12/2007 | Yang et al. |
| 7,671,461 | B2 | 3/2010 | Yang et al. |
| 7,948,000 | B2 * | 5/2011 | Yang et al. ...................... 257/99 |
| 8,022,520 | B2 * | 9/2011 | Yang et al. ..................... 257/678 |
| 2001/0022382 | A1 | 9/2001 | Shook |
| 2002/0114058 | A1 | 8/2002 | De Reus et al. |
| 2002/0132389 | A1 | 9/2002 | Patel et al. |
| 2002/0181838 | A1 | 12/2002 | Cunningham et al. |
| 2003/0025984 | A1 | 2/2003 | Gudeman et al. |
| 2003/0104651 | A1 | 6/2003 | Kim et al. |
| 2004/0012838 | A1 | 1/2004 | Huibers |
| 2004/0016995 | A1 | 1/2004 | Kuo et al. |
| 2004/0087053 | A1 | 5/2004 | Lytle et al. |
| 2004/0104460 | A1 | 6/2004 | Stark |
| 2004/0217919 | A1 | 11/2004 | Piehl et al. |
| 2004/0219764 | A1 | 11/2004 | Syllasios et al. |
| 2005/0101059 | A1 | 5/2005 | Yang et al. |
| 2005/0233546 | A1 | 10/2005 | Oohata et al. |
| 2007/0072328 | A1 | 3/2007 | Yang et al. |
| 2007/0128818 | A1 | 6/2007 | Yang et al. |
| 2007/0235852 | A1 | 10/2007 | Yang et al. |

FOREIGN PATENT DOCUMENTS

| | | |
|---|---|---|
| WO | WO 01/29890 A2 | 4/2001 |
| WO | WO 2003/054927 A2 | 7/2003 |
| WO | WO 2004/099065 A1 | 11/2004 |

OTHER PUBLICATIONS

Notification of Reason for Rejection and English Translation for Japanese Patent Application No. 2004-310022, mailed on Jul. 19, 2011, 3 pages.

Office Action, Notification of Reasons for Refusal for Japanese Patent Application No. 2004-310022, mailed on Jul. 6, 2010, 6 pages.

Office Action of Jun. 5, 2009 for related Chinese Patent Application No. 200710170345.1, 6 pages.

Office Action of Jun. 5, 2009 for related Chinese Patent Application No. 200710170344.7, 5 pages.

Non-Final Office Action of Nov. 25, 2011 for U.S. Appl. No. 11/854,357, 18 pages.

Final Office Action of Aug. 5, 2011 for U.S. Appl. No. 11/854,357, 17 pages.

Notice of Allowance of May 11, 2011 for U.S. Appl. No. 11/512,661, 9 pages.

Non-Final Office Action of Feb. 14, 2011 for U.S. Appl. No. 11/854,357, 21 pages.

Notice of Allowance of Feb. 2, 2011 for U.S. Appl. No. 11/672,114, 7 pages.

Interview Summary of Dec. 7, 2010 for U.S. Appl. No. 11/672,114, 3 pages.

Final Office Action of Nov. 24, 2010 for U.S. Appl. No. 11/512,661, 16 pages.

Office Communication of Sep. 24, 2010 for U.S. Appl. No. 11/672,114, 14 pages.

Non-Final Office Action of Apr. 13, 2010 for U.S. Appl. No. 11/512,661, 21 pages.

Non-Final Office Action of Mar. 31, 2010 for U.S. Appl. No. 11/672,114, 12 pages.

Advisory Action of Mar. 16, 2010 for U.S. Appl. No. 11/854,357, 6 pages.

Final Office Action of Dec. 18, 2009 for U.S. Appl. No. 11/854,357, 14 pages.

Non-Final Office Action of Oct. 27, 2009 for U.S. Appl. No. 11/672,114, 9 pages.

Notice of Allowance of Oct. 20, 2009 for U.S. Appl. No. 11/560,784, 7 pages.

Non-Final Office Action of Sep. 4, 2009 for U.S. Appl. No. 11/763,064, 32 pages.

Final Office Action of Jun. 5, 2009 for U.S. Appl. No. 11/560,784, 20 pages.

Office Action of May 29, 2009 for U.S. Appl. No. 11/854,357, 16 pages.

Non-Final Office Action of Mar. 24, 2009 for U.S. Appl. No. 11/672,114, 16 pages.

Non-Final Office Action of Mar. 2, 2009 for U.S. Appl. No. 11/763,064, 27 pages.

Non-Final Office Action of Dec. 18, 2008 for U.S. Appl. No. 11/560,784, 20 pages.

Notice of Allowance of Aug. 15, 2006 for U.S. Appl. No. 10/693,323, 7 pages.

Notice of Allowance of May 23, 2006 for U.S. Appl. No. 10/693,323, 8 pages.

Non-Final Office Action of Nov. 29, 2005 for U.S. Appl. No. 10/693,323, 18 pages.

Final Office Action of Apr. 25, 2012 for U.S. Appl. No. 11/854,357, 21 pages.

* cited by examiner

METHOD AND SYSTEM FOR HERMETICALLY SEALING PACKAGES FOR OPTICS

CROSS-REFERENCES TO RELATED APPLICATIONS

This application is a division of U.S. patent application Ser. No. 11/672,114 filed on Feb. 7, 2007, which is continuation of U.S. patent application Ser. No. 11/560,784, filed Nov. 16, 2006; which is a continuation of U.S. patent application Ser. No. 10/693,323, filed Oct. 24, 2003, the disclosure of which is incorporated herein by reference in its entirety for all purposes.

BACKGROUND OF THE INVENTION

This present invention relates generally to manufacturing objects. More particularly, the invention provides a method and structure for hermetically bonding a transparent cover to a semiconductor substrate. Merely by way of example, the invention has been applied to a transparent glass cover hermetically bonded to a semiconductor wafer containing a micro-mechanical electrical system. The method and structure can be applied to display technology as well as, for example, charge coupled display camera arrays, and infrared arrays.

The packaging of silicon integrated circuits has reached a high level of maturity. FIG. 1 illustrates a simplified diagram of a conventional silicon integrated circuit package. The silicon integrated circuit die 110 is mounted on a submount 115 featuring a ball grid array 120. Wire bonds 125 are attached to the silicon die 110 to provide electrical connection to the submount 115. Typically, the silicon die 110 and the wire bonds 125 are encapsulated using a plastic encapsulant 130. The resulting package is robust and inexpensive.

The package illustrated in FIG. 1 presents several drawbacks in applications that often require more than electrical operation of the silicon integrated circuit. An example of such an application is optical reflection off an array of micromirrors or other MEMS structure. For example, these applications typically require the ability to illuminate the top of the silicon integrated circuit with optical energy and subsequently reflect the optical energy off the top of the silicon integrated circuit with high efficiency. The optical properties of the plastic encapsulant, including lack of transparency, non-uniformity of the index of refraction, and surface roughness make these packages unsuitable for this application. Additionally, many MEMS often require an open space above the surface of the silicon integrated circuit to enable the micro-electro-mechanical structures to move in the direction parallel to the plane of the MEMS as well as in the direction perpendicular to the plane of the MEMS. The physical contact that the plastic encapsulant makes with the surface of the integrated circuit, therefore, make this package unsuitable for many MEMS applications.

SUMMARY OF THE INVENTION

This present invention relates generally to manufacturing objects. More particularly, the invention provides a method and structure for hermetically bonding a transparent cover to a semiconductor substrate. Merely by way of example, the invention has been applied to a transparent glass cover hermetically bonded to a semiconductor wafer containing a micro-mechanical electrical system. The method and structure can be applied to display technology as well as, for example, charge coupled display camera arrays, and infrared arrays.

In a specific embodiment according to the present invention, a method for hermetically sealing devices is provided. The method includes providing a substrate that includes a plurality of individual chips, each of the chips including a plurality of devices. In this specific embodiment according to the present invention, the chips are arranged in a spatial manner as a first array. The array configuration in this embodiment includes a plurality of first street regions arranged in strips and a plurality of second street regions arranged in strips. The second street regions intersect the first street regions to form the array configuration. The method also includes providing a transparent member of a predetermined thickness. The transparent member in this embodiment includes a plurality of recessed regions within the predetermined thickness and arranged in a spatial manner as a second array. Preferably, each of the recessed regions is bordered by a standoff region. In this specific embodiment, the standoff region has a thickness defined by a portion of the predetermined thickness. The method also includes aligning the transparent member in a manner to couple each of the plurality of recessed regions to a respective one of said plurality of chips. The transparent member is aligned such that the standoff region is coupled to each of the plurality of first street regions and is coupled to each of the plurality of second street regions to enclose each of the chips within one of the respective recessed regions. The method also includes hermetically sealing each of the chips within one of the respective recessed regions by contacting the standoff region of the transparent member to the plurality of first street regions and second street regions. Preferably, the hermetic sealing uses at least a bonding process to isolate each of the chips within one of the recessed regions.

In an alternative specific embodiment, the invention provides a system for hermetically sealing devices. The system comprises a substrate configured to include a plurality of individual chips. Each of the chips includes a plurality of devices. Additionally, each of the chips are arranged in a spatial manner as a first array. The array configuration includes a plurality of first street regions arranged in strips and a plurality of second street regions arranged in strips. The second street regions intersect the first street regions to form the array configuration. The system further comprises a transparent member of a predetermined thickness. The transparent member is configured to include a plurality of recessed regions within the predetermined thickness. The plurality of recessed regions are arranged in a spatial manner as a second array. Furthermore, each of the recessed regions are bordered by a standoff region having a thickness defined by a portion of the predetermined thickness. The substrate and the transparent member are aligned in a manner to couple each of the plurality of recessed regions to a respective one of said plurality of chips. Accordingly, the standoff region is coupled to each of the plurality of first street regions and is coupled to each of the plurality of second street regions to enclose each of the chips within one of the respective recessed regions. Each of the chips within one of the respective recessed regions is hermetically sealed by contacting the standoff region of the transparent member to the plurality of first street regions and second street regions using at least a bonding process to isolate each of the chips within one of the recessed regions.

These and other objects and features of the present invention and the manner of obtaining them will become apparent to those skilled in the art, and the invention itself will be best

BRIEF DESCRIPTION OF THE DRAWINGS

FIGS. 4A and 4B are simplified diagrams of a transparent member according to an embodiment of the present invention formed from two transparent components.

DETAILED DESCRIPTION OF SPECIFIC EMBODIMENTS

According to the present invention, techniques for manufacturing objects are provided. More particularly, the invention provides a method and system for hermetically sealing packages for objects. Merely by way of example, the invention has been applied to the hermetic sealing of an optical micro-mirror package. The method and system can be applied to sensor technology as well as other MEMS devices where hermetic packaging is required.

Figure 1:
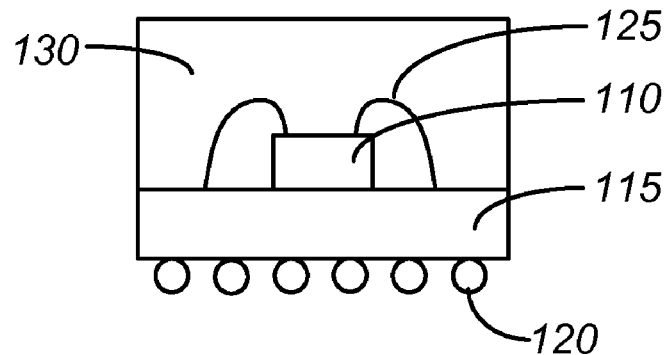
FIG. 1 is a simplified diagram of a conventional silicon integrated circuit package.
Figure 2:
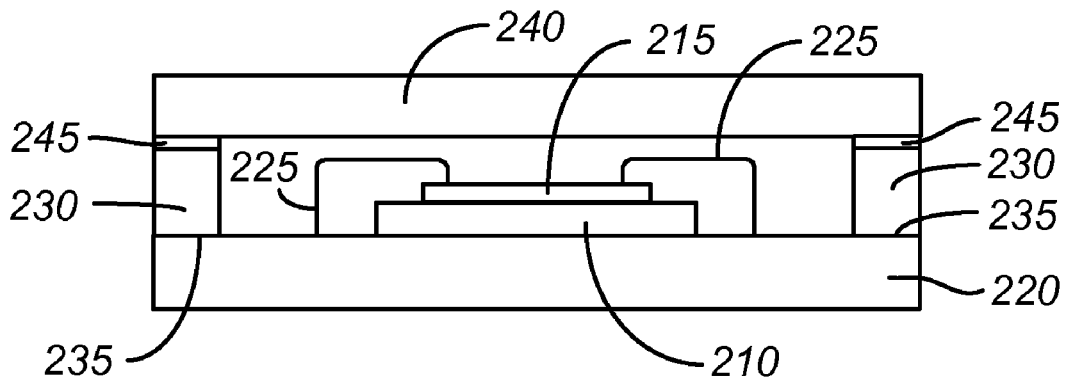
FIG. 2 is a simplified diagram of a conventional hermetically sealed transparent integrated circuit package.

FIG. 2 illustrates a simplified diagram of a conventional hermetically sealed transparent integrated circuit package useful for optical illumination of a micro-mirror array. In FIG. 2, a silicon MEMS die 210 featuring a micro-mirror array 215 is mounted on a submount 220. The die is attached to the submount using die attach procedures that are compatible with hermetically sealed packaging requirements well known to those skilled in the art. Wire bonds 225 are attached to the silicon die and the submount as with the package illustrated in FIG. 1.

To provide an open space above the micro-mirror array 215, a solid standoff 230 is typically placed near the outer edge of the submount. This standoff is typically shaped as a square annulus and fabricated from covar or other suitable materials. The standoff is often brazed onto the submount at contact points 235. A glass cover plate 240 is typically brazed onto the top of the standoff at contact points 245 to seal the package.

The cost of the package illustrated in FIG. 2 is typically high, in some cases around $70. Additionally, it is usually necessary to assemble the package in a clean room environment to prevent potential handling damage and contamination. Thus, there is a need for an improved method and system for hermetically sealing packages for objects.

FIGS. 3A-3D are simplified diagrams of a wafer-level hermetically sealed package according to an embodiment of the present invention. These diagrams illustrate examples according to specific embodiments. One of ordinary skill in the art would recognize various modifications, alternatives and variations. Preferably, formation of the package occurs prior to separation of the active devices into die form. Here, separation often occurs using a dicing and/or scribing and breaking process, among others. Additional details of the present method are provided throughout the present specification and more particularly below.

Figure 3A:
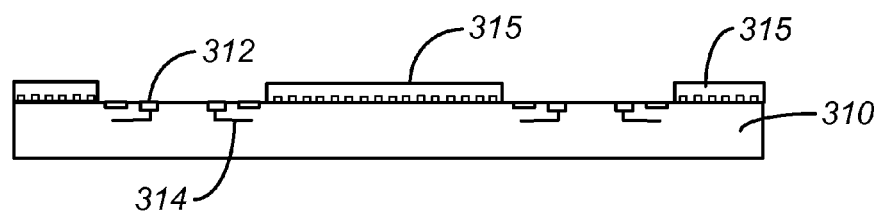
FIGS. 3A-3D are simplified diagrams of a wafer-level hermetically sealed package according to an embodiment of the present invention.

In the embodiment illustrated in FIG. 3A, a substrate 310 is processed according to methods to form an array of individual chips 315 on a substrate. In an embodiment according to the present invention, the substrate 310 is a CMOS semiconductor wafer, for example, Si, and the chips 315 are MEMS. An example of one way of forming these MEMS is described in U.S. Patent Application Ser. No. 60/390,389, commonly owned, and hereby incorporated by reference for all purposes. In the embodiment illustrated in FIG. 3A, the chips include a plurality of devices. Additionally, the CMOS wafer is processed to form integrated circuits 312, metal traces for electrical leads 314, and other CMOS structures. In an embodiment according to the present invention, the devices are micro-mirrors arranged in a multi-dimensional array, e.g., two-dimensional array. In alternative embodiments, the plurality of devices comprise a plurality of charge coupled devices (CCD), a plurality of deflection devices, a plurality of sensing devices, an integrated circuit device, any combination of these, and the like.

Figure 3B:
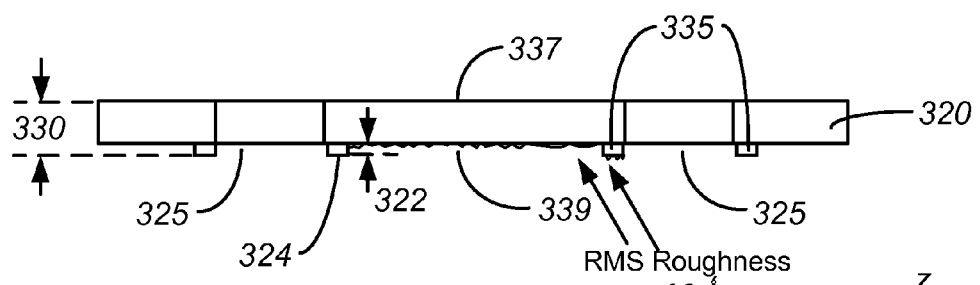
Figure 3B:
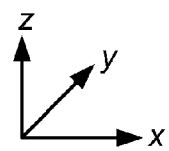

In the embodiment illustrated in FIG. 3B, a transparent member 320 is provided that includes a plurality of recessed regions 325 in the lower surface of the transparent member. The transparent member has a predetermined thickness 330. In an embodiment according to the present invention, the thickness of the transparent member is 1.2 mm. Alternatively, the thickness ranges from about 0.5 mm to about 3 mm in other embodiments. Of course, the thickness will depend upon the particular applications.

Preferably, the recessed region is a volume defined within a member. The volume has a depth 322 defined by the distance from the bottom of the transparent member 324 to the top of the recessed region 339. The outer edges of the recessed region are defined by the vertical edges of standoffs 335. In an embodiment according to the present invention, the volume of the recessed regions is uniform across the transparent member.

According to an embodiment of the present invention, the individual standoffs 335 comprise an annular rectangular ring with height 322 oriented in a plane parallel to the x-y plane. The lower surface of the standoff is prepared, in an embodiment according to the present invention, to mate to the substrate and form a bond sufficient to form a hermetically sealed package, as is discussed in detail below.

In embodiments according to the present invention, the depth of the recessed region is a predetermined depth. In the embodiment illustrated in FIG. 3B, the depth 322 of the recessed regions is 0.5 mm. Alternatively, the depth ranges from about 0.1 mm to about 1 mm in other embodiments. Of course, the depth of the recessed region will depend on the particular applications. Additionally, in embodiments according to the present invention, the area of the individual recessed regions will be a predetermined size. In the embodiment illustrated in FIG. 3B, the area of the individual recessed regions is about 14 mm×18 mm. Depending on the specific applications, this area may vary in size.

The recessed regions formed in the transparent member are arranged in a spatial manner to form a multi-dimensional array in the x-y plane. In some embodiments according to the present invention, the recessed regions are arranged to form a two-dimensional array in the x-y plane. In the embodiment illustrated in FIGS. 3A-3D, the depth and the x-y dimensions of the recessed regions 325 are greater than the height and the x-y dimensions of the chips 315. Accordingly, the chips fit within the recessed regions and the edges of the recessed regions are separated from the outer edges of the chips in all three dimensions. Moreover, in the embodiment illustrated in FIGS. 3A and 3B, the center-to-center spacing of the recessed regions in both the x and y dimensions exceeds the size of the recessed regions in both the x and y dimensions, respectively, providing space for the standoff regions 335 between adjacent chips. The lateral dimension of the standoff regions have a predetermined size. In an embodiment according to the present invention the lateral dimension of the standoff region ranges between 0.5 mm and 1.0 mm.

In an embodiment according to the present invention, the transparent member is formed from a product sold under the name of Corning® Eagle$^{2000}$™ display grade glass substrate manufactured by Corning Incorporated of Corning, N.Y. The glass substrate is characterized by high optical quality, including, but not limited to, optical power transmittance in the visible region of greater than 90%. The transmittance of light through the member can be increased by the application of anti-reflection (AR) coatings to the optical surfaces of the substrate, as disclosed below. Additionally, Corning® Eagle$^{2000}$™ display grade glass is used in some embodiments according to the present invention because the coefficient of thermal expansion of the glass substrate is close to the coefficient of thermal expansion of Si.

For a material, by definition, the thermal strain at temperature T is the change in length of a member, due to a change in temperature, $(T-T_{ref})$, divided by the original length l of that member. Denoting thermal strain at temperature T as $e_T(T)$, $$e_T(T) = \frac{\Delta l_{thermal}}{l}. \quad (1)$$

Also, by definition, the coefficient of thermal expansion for a material, denoted as $\alpha(T)$ is, $$\alpha(T) = \frac{d e_T}{dT}. \quad (2)$$

In embodiments according to the present invention in which temperature variation as a function of time is expected, it is useful to match the coefficient of thermal expansion (CTE) of the transparent cover to the CTE of the substrate. The matching of these CTEs limits the amount of warping and stress introduced in the substrate due to temperature variation.

In the embodiment illustrated in FIGS. 3A-3D, the transparent member is designed and fabricated to reduce optical absorption and thereby increase the transmission of optical energy at the wavelength range of interest. In an embodiment according to the present invention, the wavelength range of interest is the visible spectrum between 400 and 700 nm. Additionally, in this embodiment, the top surface of the member 337 and the top surface of the recessed regions 339 are polished or finished to provide optical quality surfaces. Moreover, AR coatings may be applied to the top surface of the transparent member and the top surface of the recessed regions. The AR coatings applied to the top surface of the transparent member will reduce the amount of light reflected off the top of the transparent member as it impinges on the package and thereby increase the amount of light that reaches the micro-mirror array 315. Moreover, AR coatings applied to the top of the recessed regions will reduce the amount of light reflected off the transparent member as it leaves the package. Overall system throughput will be increased by the use of these AR coatings. Quarter wave ($\lambda/4$) coatings of $MgF_2$ or other suitable dielectric materials can be used to form broadband AR coatings. For example, a $\lambda/4$ $MgF_2$ coating centered at 550 nm (with an index of refraction of 1.38 at 550 nm) deposited on a Corning® Eagle$^{2000}$™ display grade glass substrate, results in a power reflectance less than 2% per surface across the visible spectrum (400-700 nm).

The transparent member can be worked to form the recessed regions in a variety of ways. For example, in one embodiment according to the present invention, the recessed regions can be etched into the transparent member by the use of dry or wet chemical etching, laser machining, acoustic machining, water jet machining, or the like.

Figure 4B:
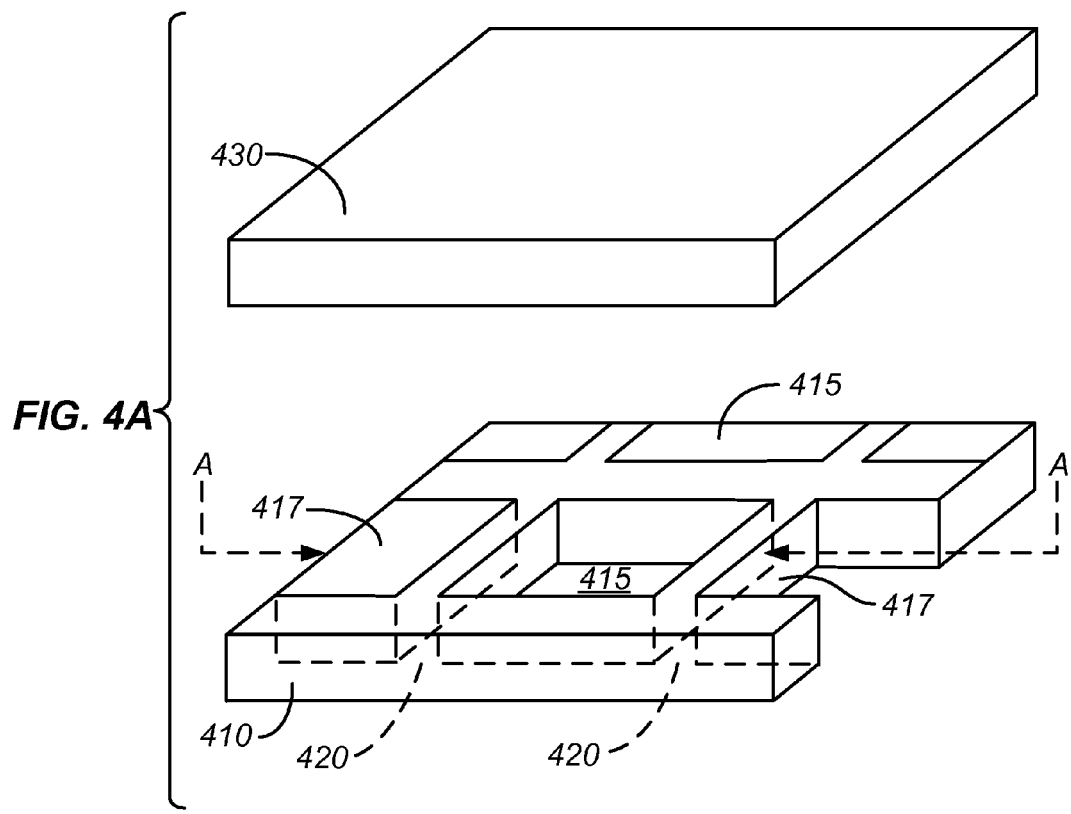
Figure 4B:
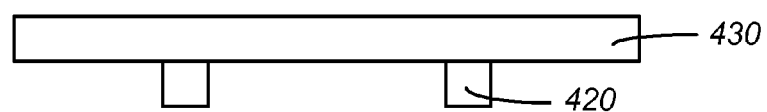

In an alternative embodiment according to the present invention, the transparent member is formed by machining a first planar component and subsequently bonding a separate transparent component to the first component as illustrated in FIG. 4. The first planar component 410 is a planar substrate that is machined or otherwise worked to form openings at locations in which recessed regions 415 are to be positioned. Additional openings are formed at positions 417 to form through holes used for attachment of wire bonds to the chip interconnect region, as will be described below. Unmachined areas of the first planar component will form the standoff regions 420. A second, planar transparent component 430 is bonded to the top of the first planar component to form the completed transparent member. In a specific embodiment according to the present invention, the first planar component and the second planar transparent component are both transparent. A side view of the completed transparent member taken along the plane A-A of FIG. 4A is illustrated in FIG. 4B. As illustrated in FIG. 4B, the standoff regions 420 and the top transparent component 430 are illustrated.

One of the benefits provided by this alternative fabrication process is that the optical properties of the two components are not always similar. In fact, for some applications, the optical properties of the first component illustrated in FIGS. 4A and 4B do not impact system performance. For example, depending on the optical path through the package, light may never impinge on the first component. In other embodiments according to the present invention, it is desirable to absorb any light that does impinge on the lower component.

In an embodiment according to the present invention, the optical properties of the transparent member are predetermined. In a specific embodiment, the transmittance and absorption coefficient of the transparent member are uniform as a function of position in the x-y plane.

In an embodiment according to the present invention, the bonding of the two transparent components is accomplished by low temperature glass frit bonding or other methods known to those of skill in the art. Additionally, AR coatings are applied to the top and bottom of the second transparent component prior to bonding to increase optical throughput. As discussed above, in this embodiment according to the present invention, the optical quality of the second transparent member will control the optical quality of light passing through the top of the recessed regions, enabling the use of polishing and coating methods not applicable to embodiments in which the transparent member is formed from a single substrate.

Figure 3C:
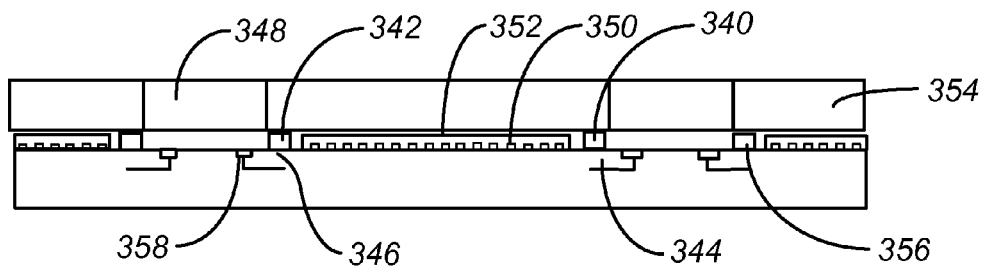

In an embodiment according to the present invention, hermetically sealed die-level packages are formed by coupling the transparent member to the substrate. FIG. 3C is a simplified diagram of the transparent member and the substrate at the time of hermetic sealing. The transparent member is aligned in a manner to position the standoff regions 340 and 342 above the street regions 344 and 346. The individual chips 350 are located below and in communication with an associated recessed region 352 and hermetically sealed by the transparent cover 354 at contact points 356 located at the base of the standoff regions 342. Through holes 348 provide access to bond pads 358 located on the CMOS wafer.

Hermetic sealing of the transparent member to the substrate is performed according to several methods well known to those skilled in the art. For example, in an embodiment according to the present invention, hermetic sealing is performed by plasma activated covalent wafer bonding (PACWB). PACWB is performed at room temperature after the substrate and transparent member have been cleaned, for example, in SC1 ($NH_3:H_2O_2:H_2O$, 1:4:20) at 60° C., rinsed in de-ionized (DI) water, dipped in 2% HF for 20 seconds, rinsed in DI water and dried with $N_2$ or air. The substrate and transparent member are then exposed, for example, to an oxygen plasma in a reactive ion etcher at a chamber pressure of about 35 mTorr. In an alternative embodiment according to the present invention, the substrate and transparent member are exposed to an argon plasma. After plasma treatment, the surface of the silicon oxide is hydrophilic, promoting bonding. The substrate and the transparent member are brought into contact at room temperature in a preselected ambient environment. In alternative embodiments according to the present invention, other bonding techniques are used, for example, eutectic low temperature bonding and anodic bonding.

In an embodiment according to the present invention, the hermetic sealing process illustrated in FIG. 3C is performed in an environment comprising inert gases. Examples of inert gases are $N_2$ and Ar, among others. The benefits provided by hermetic sealing in an inert environment include, but are not limited to dampening of oscillations present in the devices and the prevention of electrical arcing. For example, if the devices are micro-mirrors arranged in an array, oscillations present during operation and motion of the micro-mirrors are damped and attenuated by the presence of the inert gas. Additionally, the possibility of electrical arcing between the elements of the micro-mirror array and/or the drive electronics is reduced by the presence of the inert gas.

Figure 5A:
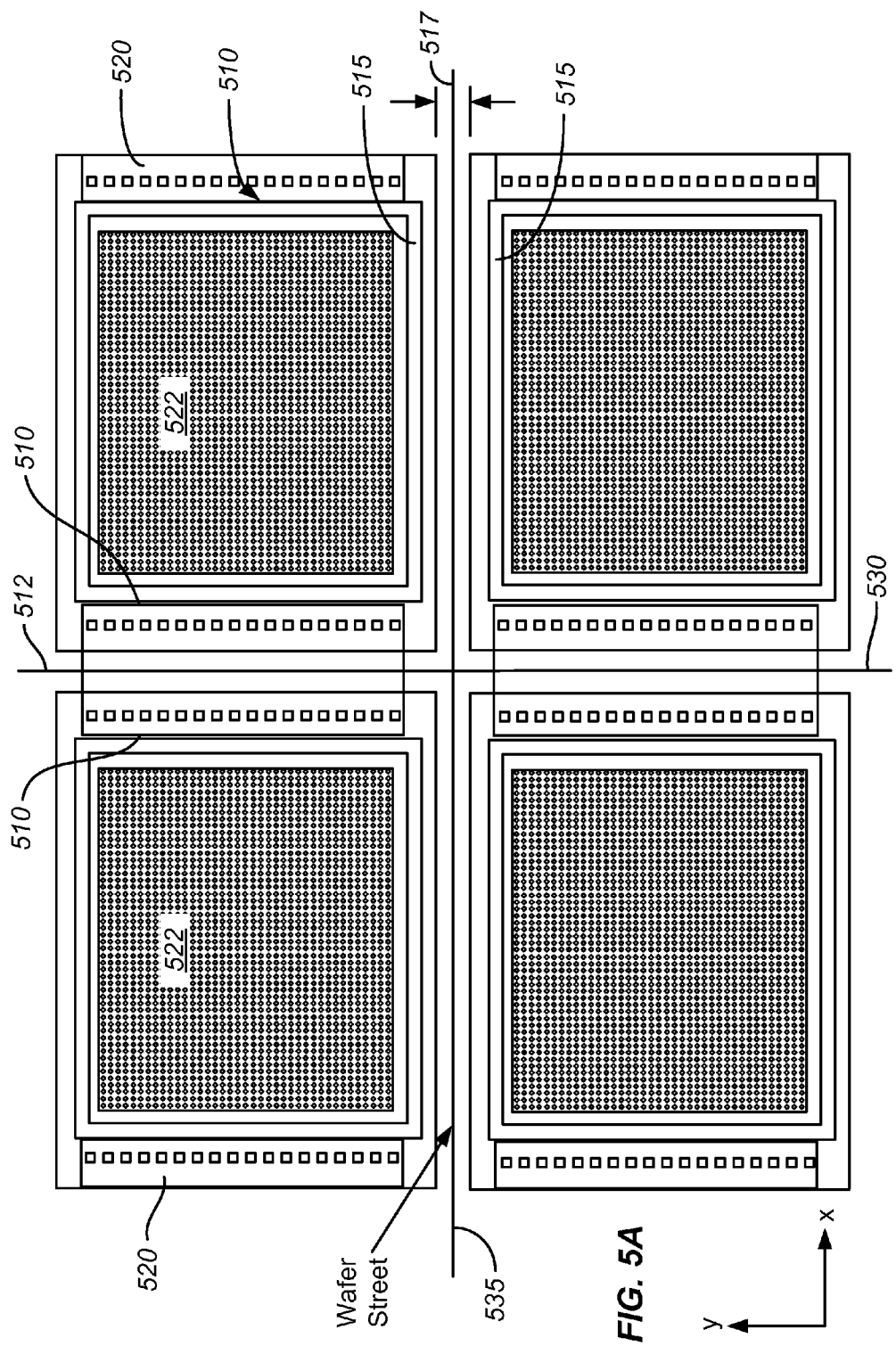
FIG. 5A is a simplified top view of a transparent member and substrate according to an embodiment of the present invention at the time of hermetic sealing.

FIG. 5A is a top-view of the device illustrated in FIG. 3C at the time of hermetic sealing. The standoff regions 510 running in the y-direction are located above the parallel street regions 512 and the standoff regions 515 running in the x-direction are located above the parallel street regions 517. Bond pads 520 are located at the right and left sides of the active devices 522. As illustrated in FIG. 3C, through holes 348 in the transparent member provide access to the bond pads.

Figure 5B:
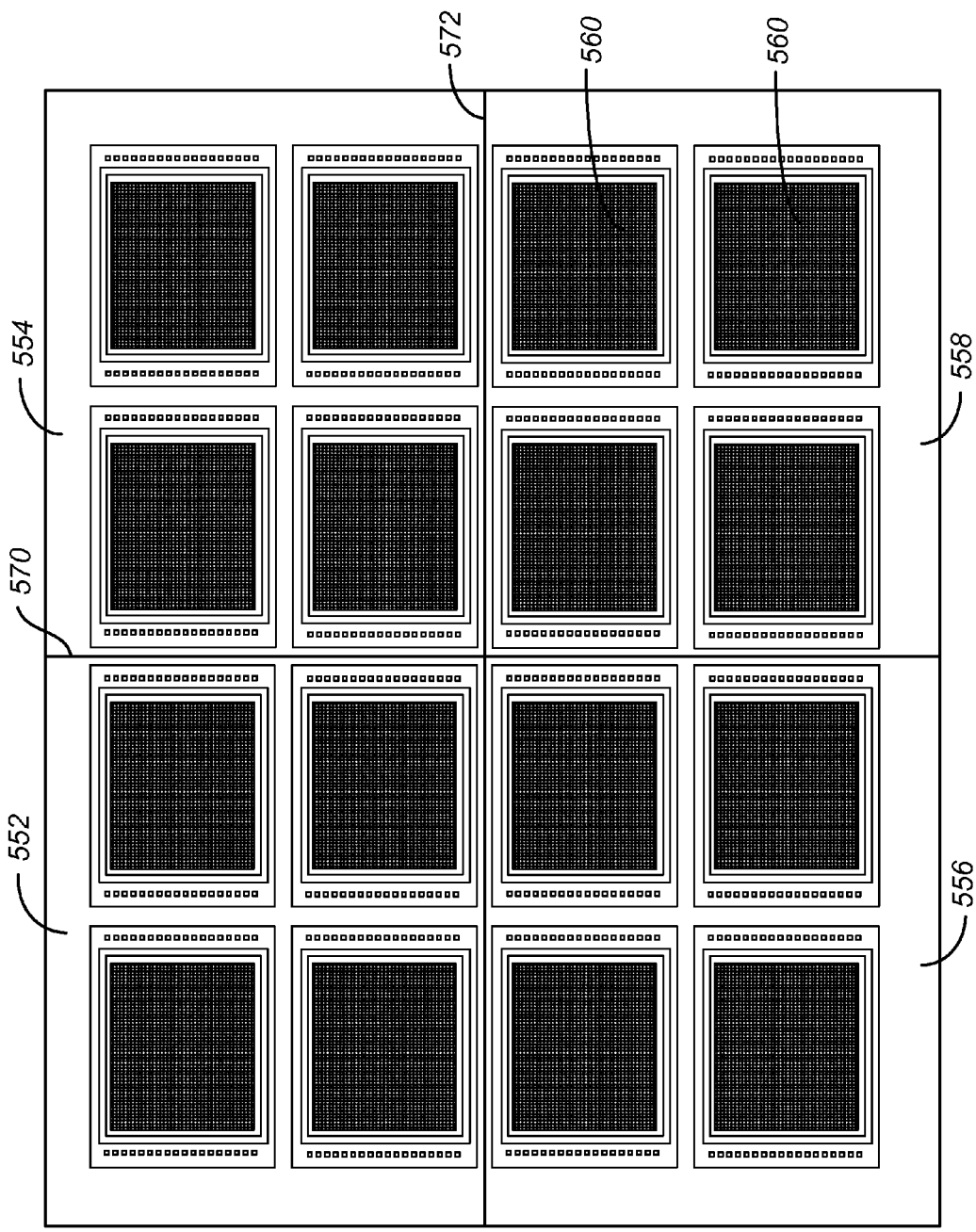
FIG. 5B is a simplified diagram of four transparent members and a substrate according to an alternative embodiment of the present invention at the time of hermetic sealing.

In an embodiment according to the present invention, the hermetic sealing process is performed by bonding a single transparent member to a single substrate. In this embodiment, the size of the single transparent member is selected to correspond to the size of the substrate. For example, a transparent member approximately 30 cm in width and length is bonded to a substrate 30 cm in diameter. Alternatively, the transparent member may be rectangular and larger in size than the substrate. In an alternative embodiment according to the present invention, the size of the transparent substrate is only a fraction of the substrate size. In this alternative embodiment, before hermetic sealing, multiple transparent members are arranged to align with matched areas on the substrate surface. The multiple transparent members are subsequently bonded to the substrate. For example, FIG. 5B illustrates a simplified diagram of four transparent members 552, 554, 556, and 558 arranged in a two-dimensional array above an array of chips 560 located on the substrate. In the alternative embodiment illustrated in FIG. 5B, the transparent members are manufactured so that adjacent transparent members abut each other at planes 570 and 572. However, this is not necessary. Additional alternative embodiments according to the present invention may align the transparent members differently.

Figure 3D:
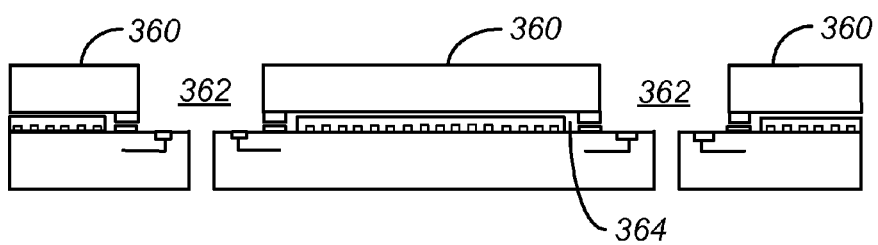

FIG. 3D illustrates, according to an embodiment of the present invention, the separation of individual dies after hermetic sealing is completed. In the embodiment illustrated in FIG. 3D, the individual dies 360 are separated along lines running in the y-direction located between adjacent bond pads. In the x-direction, the dies are separated to align the plane of separation with the through holes 362 located in the transparent member outside of the recessed region 364. For comparison, the lines in the y-direction and x-direction are illustrated in FIG. 5A as lines 530 and 535, respectively.

In a specific embodiment according to the present invention, the individual dies are separated by cutting the substrate into dies using a diamond saw. In an alternative embodiment, the dies are separated by scribing the substrate using a diamond scribe. In an embodiment of the invention in which the substrate is a silicon wafer, the die separation is performed by sawing the silicon substrate with a rotating circular abrasive saw blade.

Figure 6:
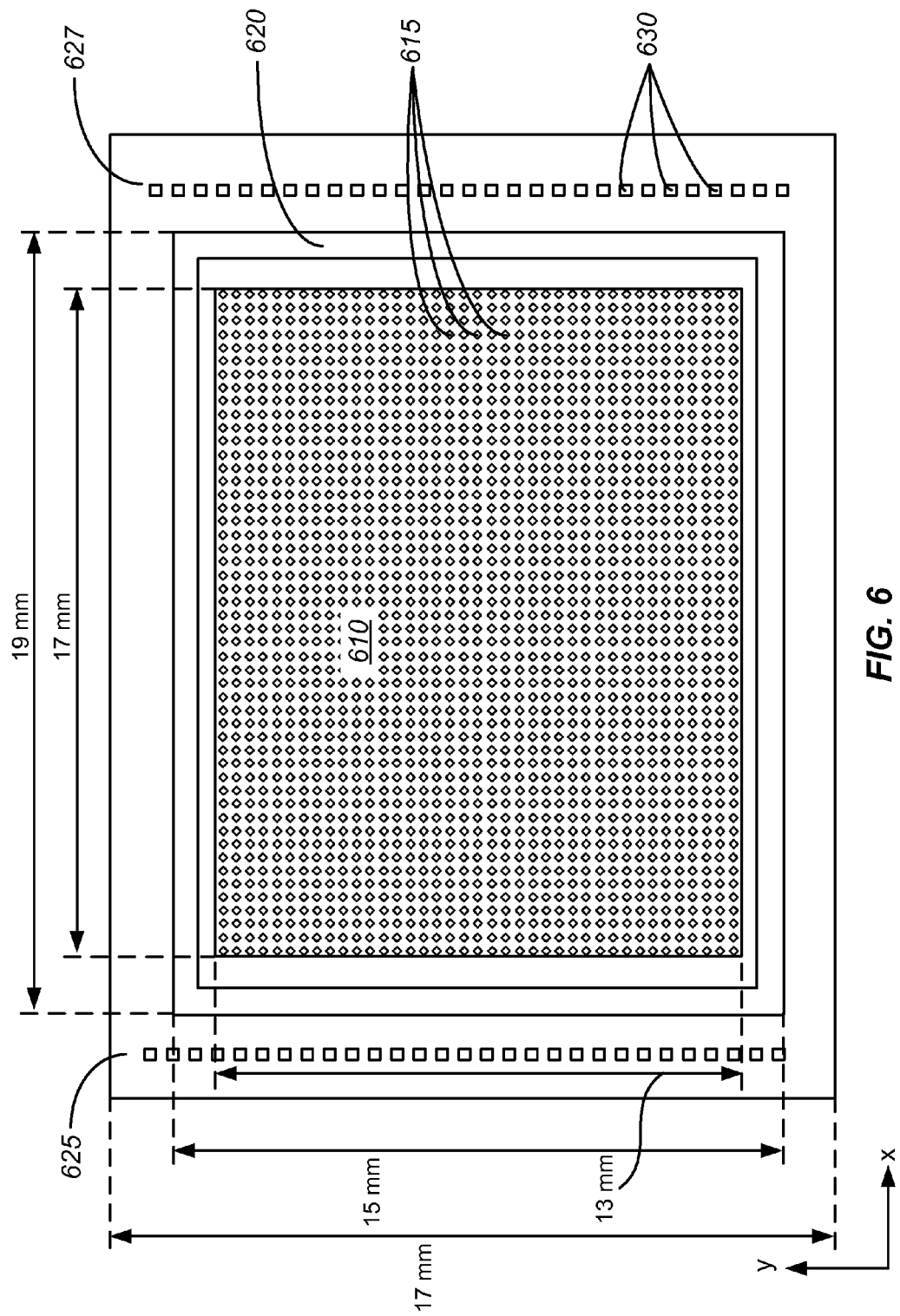
FIG. 6 is a simplified diagram of a single micro-mirror chip after hermetic sealing according to an embodiment of the present invention.

FIG. 6 is a top-view of a single die according to an embodiment of the present invention. The lateral dimensions of the chip and recessed region are predetermined sizes. In the embodiment illustrated in FIG. 6, the lateral dimensions of the chip 610 is about 17 mm by 13 mm. The center to center spacing of the chip is about 21 mm in the x-direction and 17 mm in the y-direction. The chip in this specific embodiment comprises a 1024×768 array of micro-mirrors 615. The edges of the micro-mirrors are separated from the standoff regions 620 in the x and y directions by a distance of 0.5 mm. The standoff regions are 0.5 mm in width. Through holes 625 and 627 to the left and right of the standoff regions, respectively, provide access to bond pads 630 100 μm in size and set on a 150 μm pitch. Alternatively, the center to center spacing of the chip 610 is 16 mm×12 mm, resulting in a separation between the chip and the standoff regions of 0.25 mm. Of course, these dimensions will depend upon the particular applications.

In an embodiment according to the present invention, the surface roughness of the standoff regions that come in contact with the substrate is reduced to a predetermined level. An Atomic Force Microscopy (AFM) is typically used to characterize the surface roughness of the lower surface of the standoff region. For example, a Digital Instruments Enviro-Scope™ from Veeco Instruments, Inc. can be used.

For example, in a specific embodiment according to the present invention, the root mean square surface roughness of the lower surface of the standoff regions is less than or equal to 2 Å for a 2 μm by 2 μm area. In alternative embodiments according to the present invention, the surface roughness is about 3 Å RMS over a 2 μm by 2 μm area.

Figure 7:
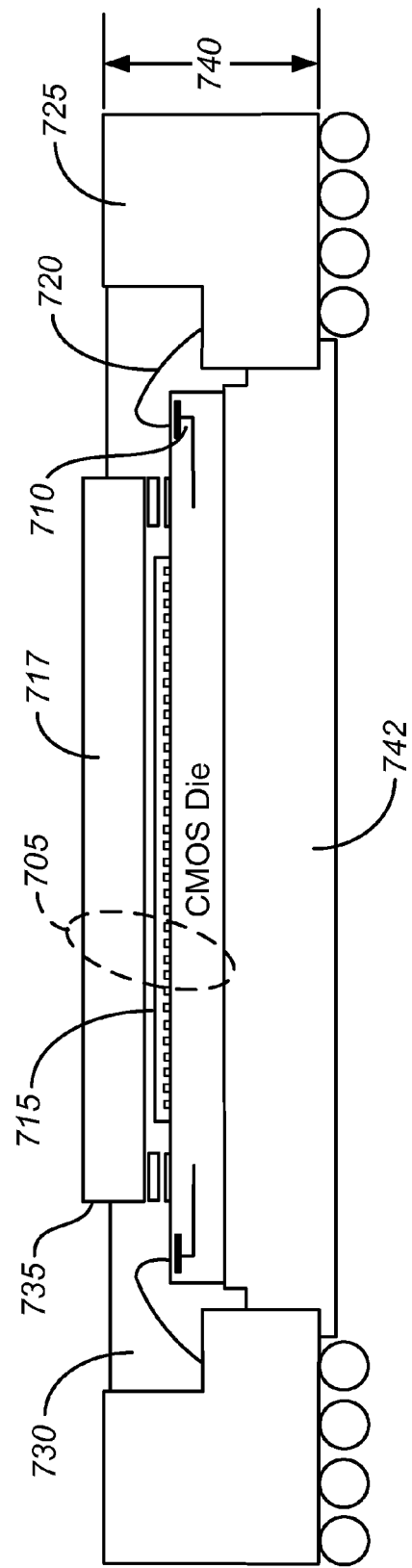
FIG. 7 is a simplified diagram of a die level package including a hermetically sealed die according to an embodiment of the present invention.

FIG. 7 is a simplified diagram of a die level package useful for making electrical connection to a hermetically sealed package and mounting the package according to an embodiment of the present invention.

FIG. 7 illustrates an embodiment according to the present invention in which the hermetically sealed package is mounted on a lead frame structure, such as a ball grid array. The separated CMOS die, chip, and hermetically sealed package previously described are illustrated as 705. In an embodiment according to the present invention, at least one interconnect region is associated with each chip on the substrate. In the embodiment illustrated in FIG. 7, the interconnect region or bonding pads 710 are located, for example, on or near the top surface of the wafer. In an embodiment according to the present invention, the interconnect pads are electrically connected to the plurality of devices to actuate the mechanical devices according to a MEMS algorithm. Thus, electrical signals presented at the interconnect region 710 result in mechanical motion of the devices 715. As disclosed previously, in a specific embodiment according to the present invention, the electrical signals presented at the interconnect region 710 deflect some or all of the micro-mirrors present in the micro-mirror array to preferentially reflect light passing through the transparent member 717 and incident on the micro-mirror array.

In order to electrically connect the interconnect region (and thus the devices) to external drivers, wire bonds 720 are connected from the interconnect pads 710 to electrical connections located on the lead frame structure 725. In an embodiment according to the present invention, the wire bonds are made using Au wires about 25 µm in diameter, which are capable of carrying in excess of 500 mA of current. In the embodiment according to the present invention illustrated in FIG. 7, the wire bonds are encapsulated in encapsulant 730. The use of encapsulants, for example, plastic, to protect electrical components from environmental damage is well known to those skilled in the art. The lead frame, in some embodiments, is brazed onto a heat spreader 742 to reduce the thermal load on the hermetically sealed package.

In FIG. 7, the encapsulant is applied to encapsulate at least a portion of the lead frame, the wire bonds, the interconnect regions, and the sides of the transparent member adjacent the through holes, while maintaining a surface region 735 of the transparent member located above the recessed region free from encapsulant. Thus, the optical properties of the surface region 735 are unaffected by the application of the encapsulant. In the embodiment illustrated in FIG. 7, the total thickness 740 of the die level package is 1.27 mm. Thus, the package illustrated in FIG. 7 combines both a hermetically sealed package useful for optical MEMS and a non-hermetically sealed plastic encapsulated package.

Figure 8:
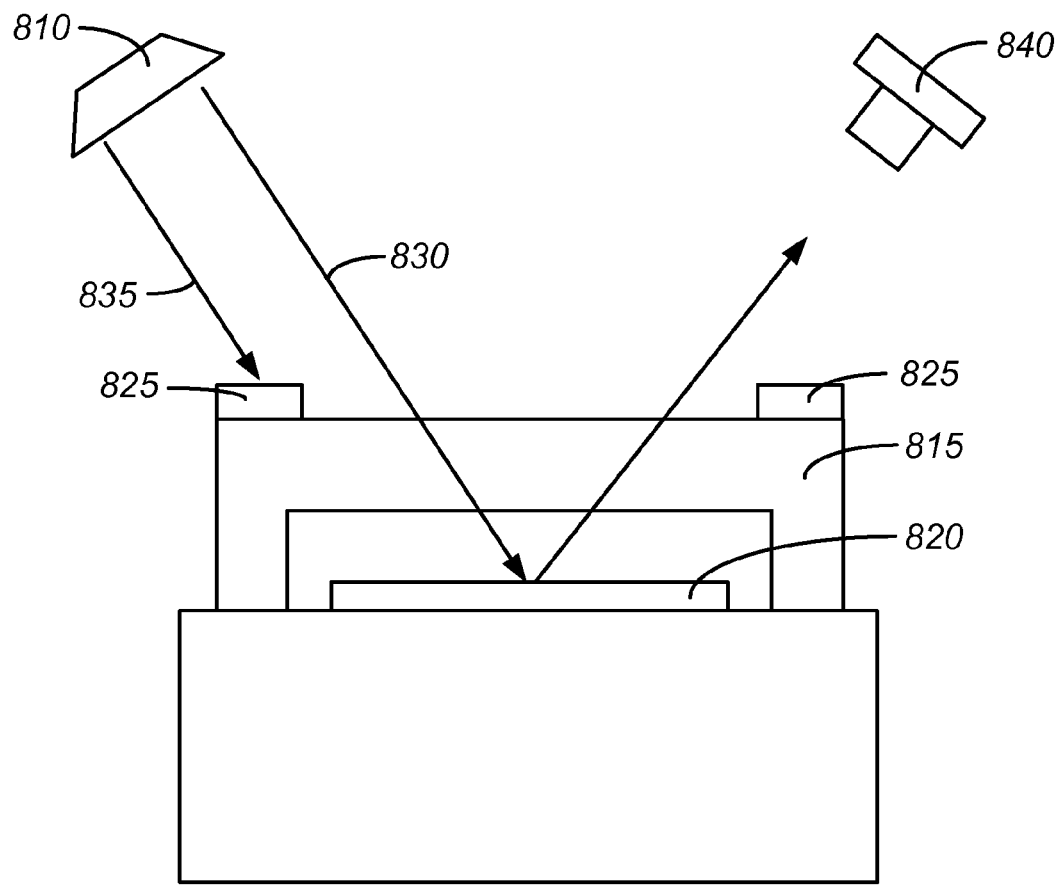
FIG. 8 is a simplified diagram illustrating the operation of a reflective system according to an embodiment of the present invention.

FIG. 8 illustrates the operation of a reflective system employing a specific embodiment of the present invention. In embodiments according to the present invention, it is desirable to spatially filter light incident on and reflected from the package. In the embodiment illustrated in FIG. 8, a beam of light from a light source 810 is incident on the top surface of the transparent member 815. A portion of the light 830 passing through the transparent member is incident on the surface of the plurality of devices, in this embodiment, a micro-mirror array 820. Another portion of the light 835 from the lamp 810 is blocked or filtered by filter mask 825 located at the periphery of the transparent member. Light blocked by the left, top and bottom sides of filter mask 825 is not able to reach the micro-mirror array. In addition, light reflected off portions of the chip other than the micro-mirror array is blocked by the right side of the filter mask. Thus, by the use of filter mask 825, the reflected light passing to detector 840 is limited to a selected portion of the original beam that is incident on the package.

In the embodiment illustrated in FIG. 8, the filter mask is located on the upper surface of the transparent member, however, this is not required. In alternative embodiments, the filter mask is located on the lower surface or sides of the transparent member. In an additional embodiment according to the present invention, the use of non-transparent materials in the fabrication of the transparent member can complement the filter mask. In an embodiment according to the present invention, the filter mask comprises a layer of chrome. In alternative embodiments, the filter mask is made from other reflective or absorptive materials.

In the embodiment illustrated in FIG. 8, the filter mask forms an aperture region that blocks light from impinging on or reflecting from portions of the die other than the micro-mirror array. In alternative embodiments, the filter mask is only used to block light on the incident (left) side and not on the exit (right) side of FIG. 8.

While the above is a complete description of specific embodiments of the invention, the above description should not be taken as limiting the scope of the invention as defined by the claims.

What is claimed is:

1. A MEMS package adapted for wafer level probing of MEMS devices, the MEMS package comprising:
   a substrate comprising:
      a plurality of MEMS chips, each of the plurality of MEMS chips including a plurality of devices, the plurality of MEMS chips being arranged in a spatial manner as a first array configuration, the first array configuration including a first separation region extending in a first direction between each of the plurality of individual chips and a second separation region extending in a second direction between each of the plurality of individual chips, the first direction being oriented at an angle with respect to the second direction; and
      one or more bond pads located adjacent to each of the plurality of MEMS chips, wherein the one or more bond pads are in electrical communication with the plurality of devices in each of the plurality of MEMS chips; and
   a transparent member of a predetermined thickness, the transparent member comprising:
      a plurality of recessed regions within the predetermined thickness, wherein the plurality of recessed regions are arranged in a spatial manner as a second array aligned with the first array configuration, and wherein each of the plurality of recessed regions are bordered by a standoff region joined to the substrate, the standoff region having a thickness defined by a portion of the predetermined thickness; and
      one or more access regions passing through the transparent member and providing wafer level probing access to the one or more bond pads.

2. The MEMS package of claim 1 wherein an interface between the standoff region and the substrate comprises a hermetic seal.

3. The MEMS package of claim 1 wherein each of the plurality of MEMS chips are hermetically sealed within one of the plurality of recessed regions.

4. The MEMS package of claim 1 wherein the plurality of devices comprises at least one of charge coupled devices, sensing devices, or integrated circuit devices.

5. The MEMS package of claim 1 wherein the plurality of devices comprise deflection devices.

6. The MEMS package of claim 5 wherein the deflection devices comprise micro-mirror structures.

7. The MEMS package of claim 1 wherein the one or more bond pads comprise a first set of bond pads located adjacent to a first side of each of the plurality of MEMS chips.

8. The MEMS package of claim 7 further comprising a second set of bond pads located adjacent to a second side of each of the plurality of MEMS chips, the second side being opposite to the first side.

9. The MEMS package of claim 7 further comprising one or more additional sets of bond pads, each of the one or more additional sets of bond pads being located adjacent an additional side of each of the plurality of MEMS chips, the additional side being oriented 90 degrees with respect to the first side.

10. The MEMS package of claim 1 wherein one or more access regions comprise a plurality of holes passing through the transparent member.

11. The MEMS package of claim 1 wherein the one or more bond pads are located in at least one of the first separation region or the second separation region.

12. The MEMS package of claim 1 wherein the transparent member comprises an antireflective coating disposed overlying surface regions of each of the plurality of recessed regions.

13. The MEMS package of claim 1 wherein the transparent member comprises a first transparent member overlying a second transparent member including the standoff region.

14. The MEMS package of claim 1 wherein the transparent member is characterized by a thickness ranging from about 0.1 mm to 1.2 mm.

15. The MEMS package of claim 1 wherein each of the plurality of MEMS chips is maintained within an inert environment within one of the plurality of recessed regions.

16. The MEMS package of claim 1 wherein the inert environment is selected from nitrogen, argon, or a mixture of nitrogen and argon.

17. The MEMS package of claim 1 wherein each of the plurality of recessed regions comprises a first surface region opposing a second surface region, at least one of the first surface region or the second surface region being characterized by a root mean square surface roughness of less than or equal to 2 Å for a 2 µm by 2 µm area.

18. The MEMS package of claim 1 wherein each of the plurality of recess regions has a depth of about 0.5 mm and less.

19. The MEMS package of claim 1 wherein the transparent member comprises a first side and a second side, the first side being parallel to the second side, the first side and the second side being coated with an antireflective material.

20. The MEMS package of claim 1 wherein each of the plurality of recessed regions has a peripheral region that forms an aperture region overlying a portion of one of the plurality of MEMS chips.

* * * * *